United States Patent
Honda et al.

(10) Patent No.: US 6,849,805 B2
(45) Date of Patent: Feb. 1, 2005

(54) PRINTED WIRING BOARD AND ELECTRONIC APPARATUS

(75) Inventors: Hiromi Honda, Ibaraki (JP); Yasushi Takeuchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/022,503

(22) Filed: Dec. 20, 2001

(65) Prior Publication Data

US 2002/0086144 A1 Jul. 4, 2002

(30) Foreign Application Priority Data

Dec. 28, 2000 (JP) ........................................ 2000-403265
Feb. 27, 2001 (JP) ........................................ 2001-052336

(51) Int. Cl.⁷ ................................................ H05K 1/18
(52) U.S. Cl. ........................ 174/250; 174/260; 174/263; 420/562
(58) Field of Search ................................. 174/250, 260, 174/263, 264; 420/562; 428/209; 430/11

(56) References Cited

U.S. PATENT DOCUMENTS

| | | | | |
|---|---|---|---|---|
| 3,610,811 A | * | 10/1971 | O'Keele | |
| 5,048,747 A | * | 9/1991 | Clark et al. | 228/180.2 |
| 5,730,932 A | * | 3/1998 | Sarkhel et al. | 420/562 |
| 6,174,562 B1 | * | 1/2001 | Bergstedt | 427/97 |
| 6,175,506 B1 | | 1/2001 | Takeuchi | 361/794 |
| 6,441,312 B1 | * | 8/2002 | Tanimura et al. | 174/252 |

FOREIGN PATENT DOCUMENTS

JP    11-354919    12/1999

* cited by examiner

*Primary Examiner*—Cathy Lam
(74) *Attorney, Agent, or Firm*—Fitzpatrick, Cella, Harper & Scinto

(57) ABSTRACT

A printed wiring board is provided in which lift-off and land peeling do not occur during soldering of an inserted component onto the printed wiring board, and hence pattern breakage does not occur, but with no increase in cost. A plurality of lands 6 are each formed continuously across surfaces of a substrate and an inner peripheral surface of one of a plurality of soldering through holes 5 into which leads 2 of an inserted component 3 to be mounted onto the printed wiring board are inserted before soldering is carried out, and a solder resist 8 is coated onto the lands 6.

9 Claims, 5 Drawing Sheets

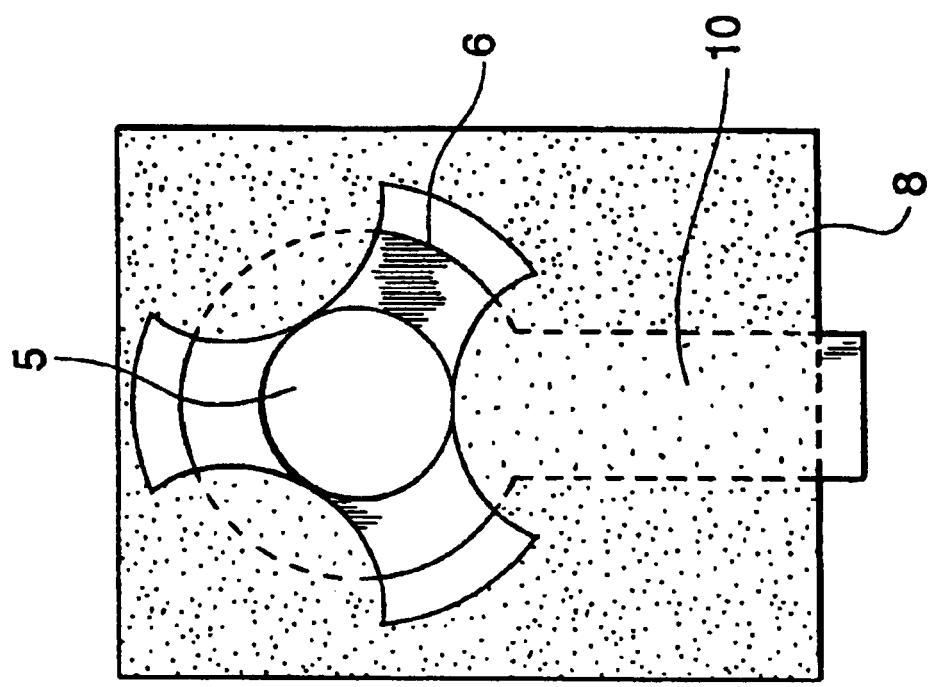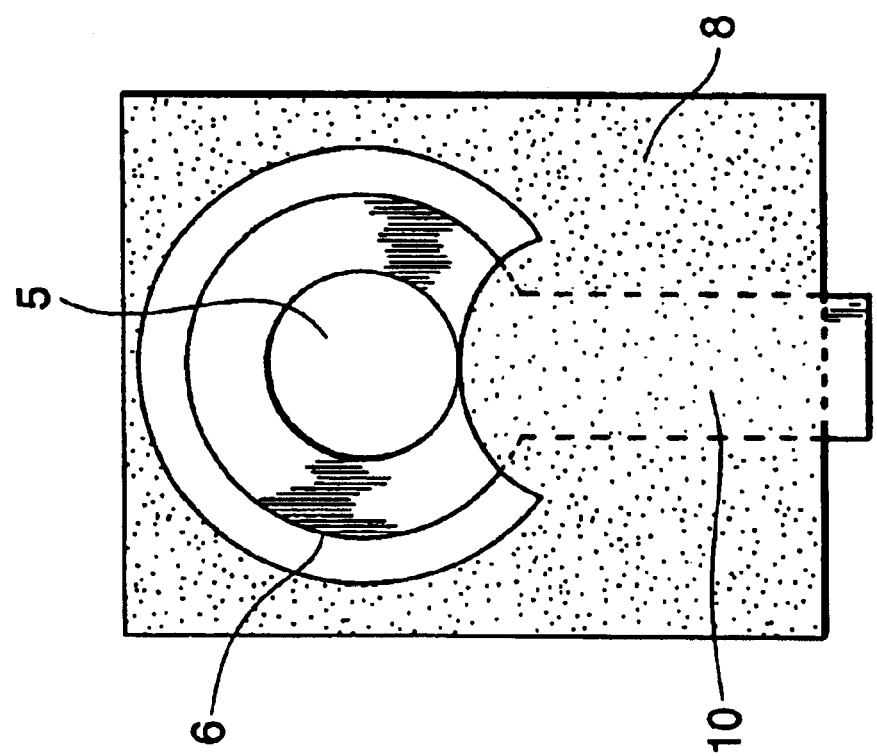

PRINTED WIRING BOARD AND ELECTRONIC APPARATUS

BACKGROUND OF THE INVENTION

1. Field of the Invention

This invention relates to a printed wiring board which is capable of preventing the occurrence of lift-off and land peeling at soldered portions when a component to be mounted on the printed wiring board (hereinafter referred to as the "inserted component" is soldered by using solder, in particular lead-free solder, and an electronic apparatus such as a printer in which is installed the printed wiring board.

2. Description of the Related Art

Soldering has conventionally been carried out using eutectic lead solder (Sn—Pb: melting point 183° C.), but in recent years there have been demands for soldering to be carried out using lead-free solder due to environmental restrictions.

However, the high-temperature-type lead-free solders that are currently most commonly used are composed mainly of Sn and Ag, and have a melting point of about 220° C. If flow soldering of an inserted component is carried out using such a high-temperature-type lead-free solder, then solidification of the solder, which is accompanied by solidification shrinkage, proceeds from the vicinity of the inserted component, which has good thermal conductivity, towards the vicinity of the printed wiring board, and hence the solder joint interface at the part of the surface of the substrate on which the inserted component is mounted in particular becomes the final solidified part, resulting in lift-off and land peeling.

Moreover, when flow soldering is carried out using lead-free solder as described above, segregation of Pb contained in the surface-treated leads of the inserted component and segregation of elements (Bismuth, etc.) contained in the lead-free solder used in the flow soldering occur during the cooling process, and the physical properties of the solder changes during the cooling process. As a result, there is a problem that the occurrence of lift-off and land peeling is increased, and in the worst cases the land peeling is accompanied by breakage (i.e., electrical disconnection) of the pattern connected to the lands.

To resolve such a problem, Japanese Laid-open Patent Publication (Kokai) No. 11-354919 discloses a method of improving countermeasures in the cooling step of the soldering process. However, there is a problem that a coolant must be used during the cooling, and hence the soldering cost rises.

FIG. 5 is a sectional view of a conventional example of a printed wiring board in which lift-off has occurred, and FIG. 6 is a sectional view of a conventional example of a printed wiring board in which land peeling has occurred.

In FIGS. 5 and 6, reference numeral 1 designates a substrate of the printed wiring board. A plurality of through holes 5 are formed in the substrate 1, and a land 6 is formed over an inner peripheral surface of each through hole 5 and opposite end surface parts of the substrate 1 formed with the through hole 5. Reference numeral 3 designates an inserted component such as an electronic component having inserted component leads 2. Each inserted component lead 2 is inserted into one of the through holes 5, and soldered to the substrate 1 with lead-free solder by flow soldering. Reference numeral 8 designates a solder resist.

In the case of a conventional printed wiring board on which lead-free soldering is carried out as described above, during the flow soldering the lead-free solder rises through each through hole 5 in a wet state, thus forming a fillet 7 between a mounting surface part of the inserted component 3 at which it is mounted onto the substrate 1 and the land 6. As a result, lift-off in which the fillet 7 between the mounting surface part of the inserted component 3 and the land 6 does not join to the land 6 may occur as shown in FIG. 5, or the land 6 may peel off along with the fillet 7 as shown in FIG. 6.

SUMMARY OF THE INVENTION

It is an object of the present invention to provide a printed wiring board in which lift-off and land peeling do not occur during soldering of an inserted component onto the printed wiring board and hence pattern breakage does not occur, but with no increase in cost, and an electronic apparatus in which is installed the printed wiring board.

To attain the above object, the present invention includes a printed wiring board comprising a substrate having two opposite surfaces, a plurality of soldering through holes formed in the substrate, for inserting leads of an inserted component to be mounted onto the printed wiring board and soldering the inserted component onto the substrate, each of the through holes having an inner peripheral surface, and a plurality of lands each formed continuously across the opposite surfaces and the inner peripheral surface of a corresponding one of the through holes, each land having a surface, and means for maintaining at least a part of the surface of each of the lands in a state not wetted by solder.

In a preferred form of the present invention, the printed wiring board further comprises at least one wiring pattern provided on at least one of the opposite surfaces and connected to the lands, and wherein the means maintains connection portions between the lands and the wiring pattern in a state not wetted by the solder.

Preferably, the means comprises a material not wetted by the solder coated onto the lands.

More preferably, the material not wetted by the solder is a solder resist.

Alternatively, the material not wetted by the solder is a silk-screen pattern.

Also alternatively, the material not wetted by the solder comprises a solder resist and a silk-screen pattern laminated onto one another.

In another preferred form of the present invention, the means comprises deactivation treatment means of oxidizing at least a part of the surface of each of the lands.

Preferably, the leads of the inserted component have been treated with lead solder.

Also preferably, the inserted component is soldered onto the substrate by flow soldering using lead-free solder.

More preferably, the lead-free solder contains Bismuth.

To attain the above object, the present also provides an electronic apparatus in which is installed a printed wiring board as constructed above.

The above and other objects, features and advantages of the invention will become more apparent from the following detailed description taken in conjunction with the accompanying drawings.

BRIEF DESCRIPTION OF THE DRAWINGS

FIG. 7 is a plan view of a printed wiring board in which a solder resist has been partially applied onto a land, according to a fifth embodiment of the present invention;

FIG. 8 is a plan view of a printed wiring board in which a solder resist has been partially applied onto a land, according to the fifth embodiment of the present invention.

DETAILED DESCRIPTION OF THE PREFERRED EMBODIMENTS

Embodiments of the present invention will now be described in detail with reference to the drawings.

(First Embodiment)

Figure 1:
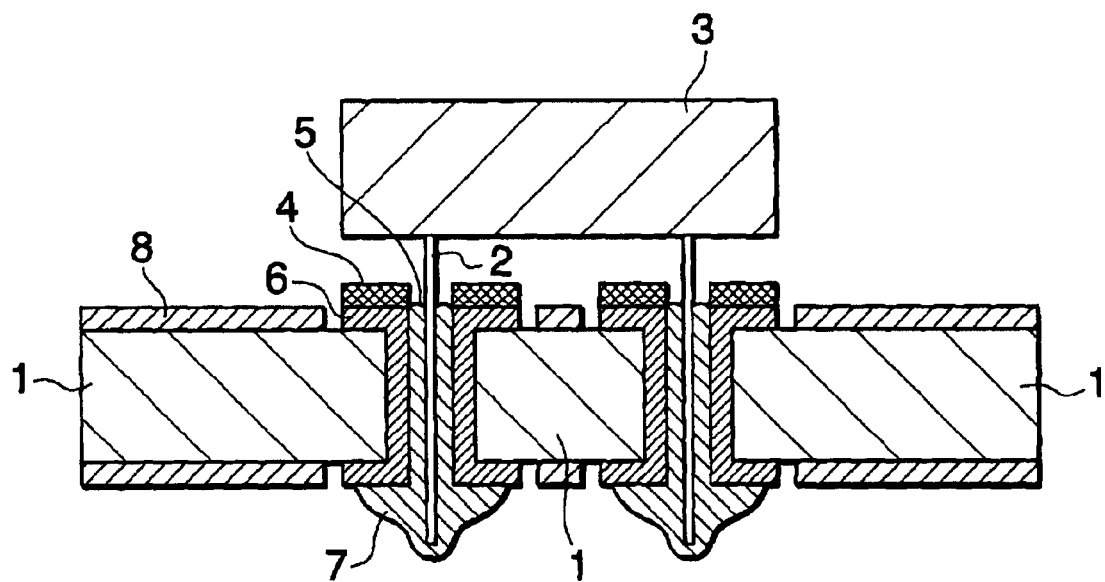
FIG. 1 is a sectional view showing a printed wiring board having an inserted component soldered thereto with lead-free solder, according to a first embodiment of the present invention.
Figure 5:
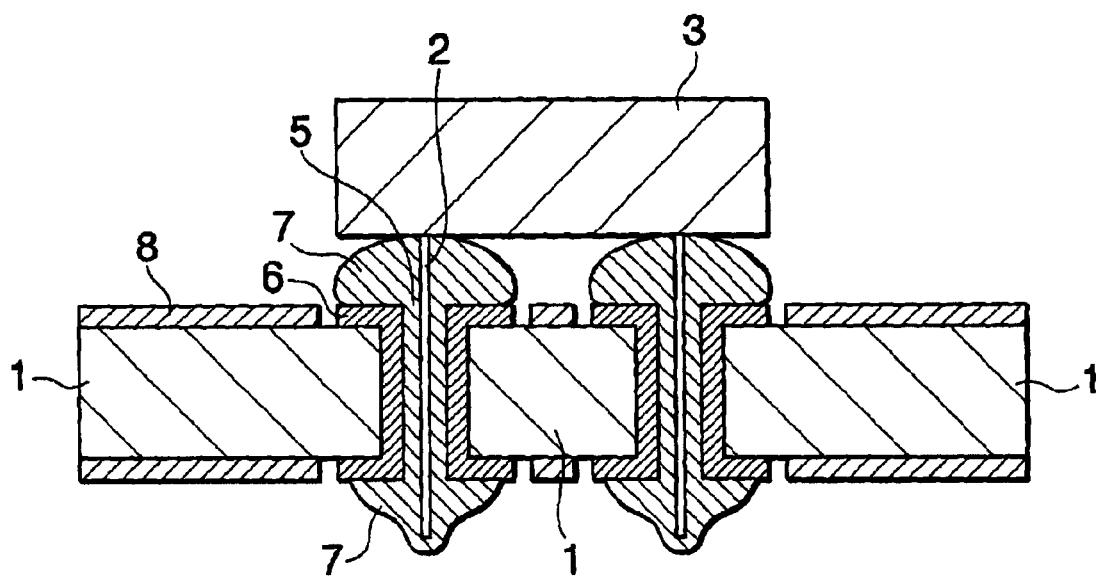
FIG. 5 is a sectional view showing a conventional example in which lift-off has occurred.
Figure 6:
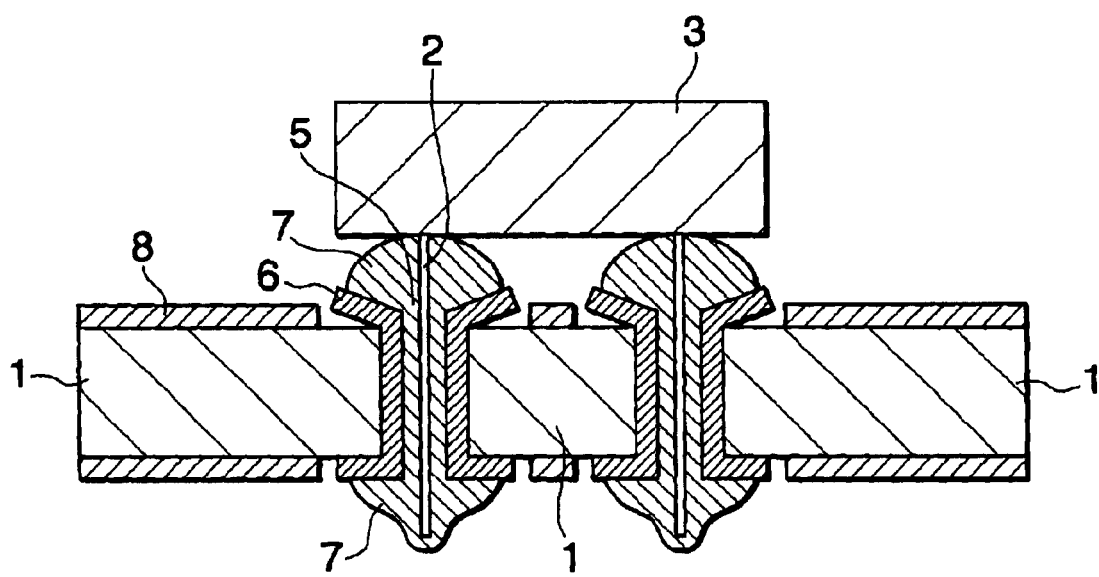
FIG. 6 is a sectional view showing a conventional example in which land peeling has occurred.

FIG. 1 is a sectional view showing a printed wiring board according to a first embodiment of the present invention in a state in which inserted component leads 2 have been flow-soldered to the printed wiring board with lead-free solder. In the present embodiment and the other embodiments described below, elements and parts corresponding to elements and parts in FIGS. 5 and 6, which show the conventional art described above, are designated by the same reference numerals as in FIGS. 5 and 6.

Other components are mounted on the printed wiring board in actual practice, but these have been omitted from the drawings as they bear no direct relation to the essence of the present invention.

The printed wiring board of the present embodiment is installed into an electronic apparatus such as a printer or a copying machine.

In FIG. 1, a plurality of through holes 5 are formed in a substrate 1 of the printed wiring board, and a land 6 is formed over an inner peripheral surface of each through hole 5 and opposite end surface parts of the substrate 1 formed with each through hole 5. Inserted component leads 2 of an inserted component 3 such as an electronic component are inserted into the through holes 5 and flow-soldered to the substrate 1 with lead-free solder.

A silk-screen pattern 4 is formed on a major surface of the substrate 1 on which the inserted component 3 is mounted, so as to cover the lands 6 (specifically an end surface of each land 6 on the major surface side of the substrate 1) that are formed on the through holes 5 for soldering the inserted component 3 mounted on the substrate 1. Note that silk-screen patterns (not shown in the drawings) that show the types, positions and numbers of components mounted on the substrate 1 and circuit diagram numbers are printed in predetermined positions on the major surface of the substrate 1, and the silk-screen pattern 4 is printed at the same time as these silk-screen patterns using the same ink.

As described above, a silk-screen pattern 4 is interposed between the lands 6 and the inserted component leads 2 on the surface part of the substrate 1 on which the inserted component 3 is mounted. As a result, it is possible to carry out flow soldering such that fillets 7 are not formed between the inserted component leads 2 and the lands 6.

Consequently, according to the present embodiment, because fillets 7 are not formed between the leads 2 of the inserted component 3 and the lands 6, good soldering can be obtained in which lift-off and land peeling do not occur and hence pattern breakage does not occur.

Figure 9:
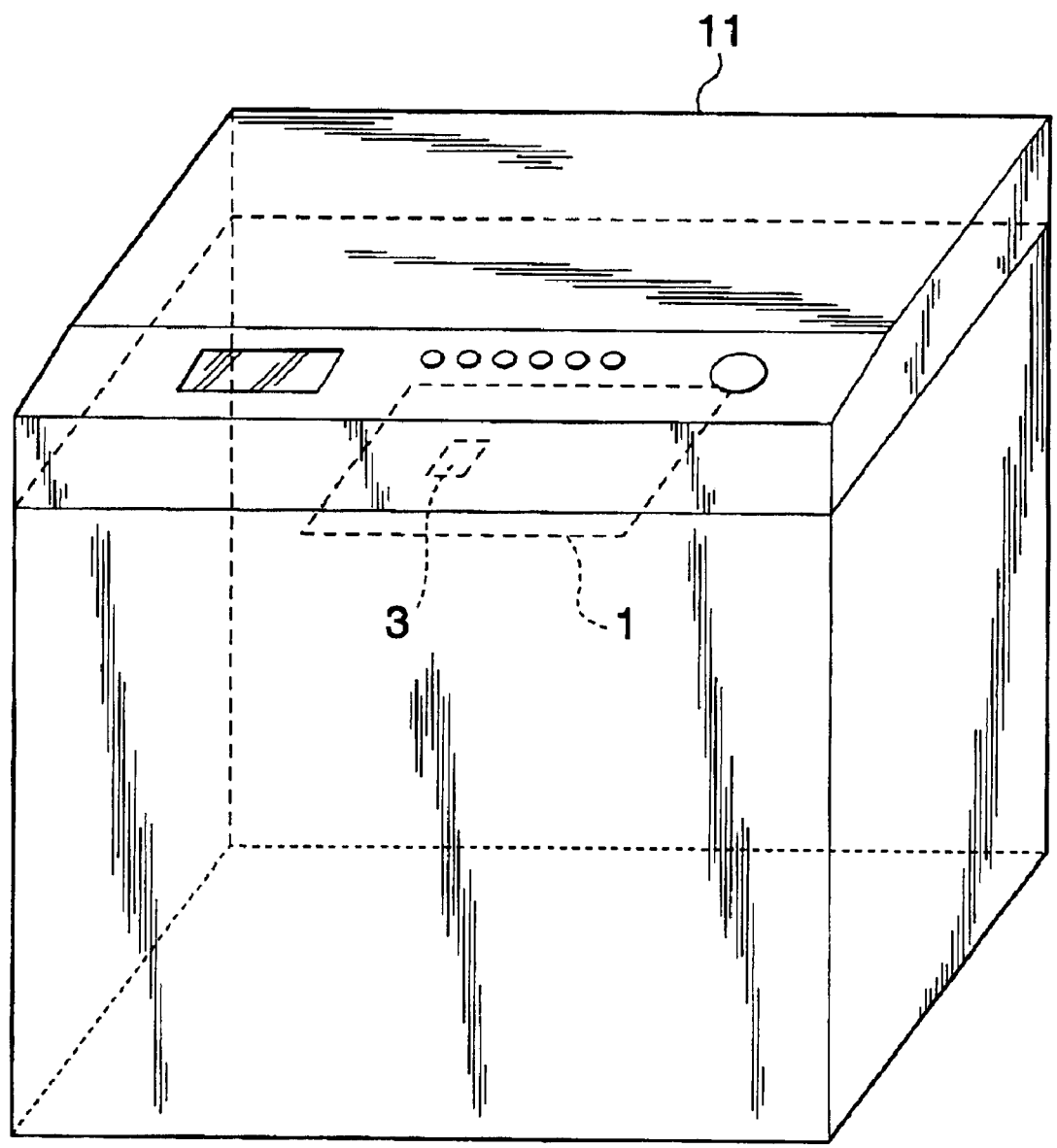
FIG. 9 is a schematic see-through view showing the printed wiring board according to the present invention installed in a copying machine, which is an example of an electronic apparatus.

FIG. 9 is a schematic see-through view showing the printed wiring board according to the present invention installed in a copying machine.

(Second Embodiment)

Figure 2:
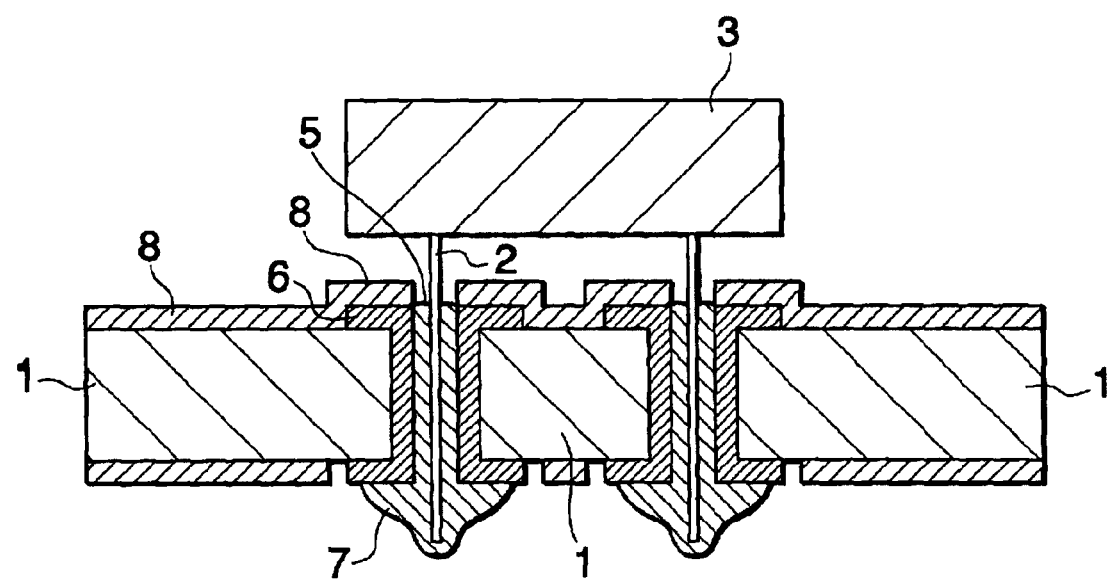
FIG. 2 is a sectional view showing a printed wiring board having an inserted component soldered thereto with lead-free solder, according to a second embodiment of the present invention.

FIG. 2 shows a second embodiment of the present invention. The constitution of the printed wiring board in the present embodiment is the same as in the first embodiment, with one change that the lands 6 are covered with a solder resist 8 rather than a silk-screen pattern 4.

Even with this constitution, similar to the case of the first embodiment, because the solder resist 8 is interposed between the inserted component leads 2 and the lands 6, it is possible to carry out flow soldering such that fillets 7 are not formed between the inserted component leads 2 and the lands 6.

Consequently, according to the present embodiment, as in the first embodiment, because fillets 7 are not formed between the inserted component leads 2 and the lands 6, good soldering can be obtained in which lift-off and land peeling do not occur and hence pattern breakage does not occur.

Moreover, the lands 6 are fixed in place by the solder resist 8, thus increasing the strength of joining between the lands 6 and the substrate 1.

(Third Embodiment)

Figure 3:
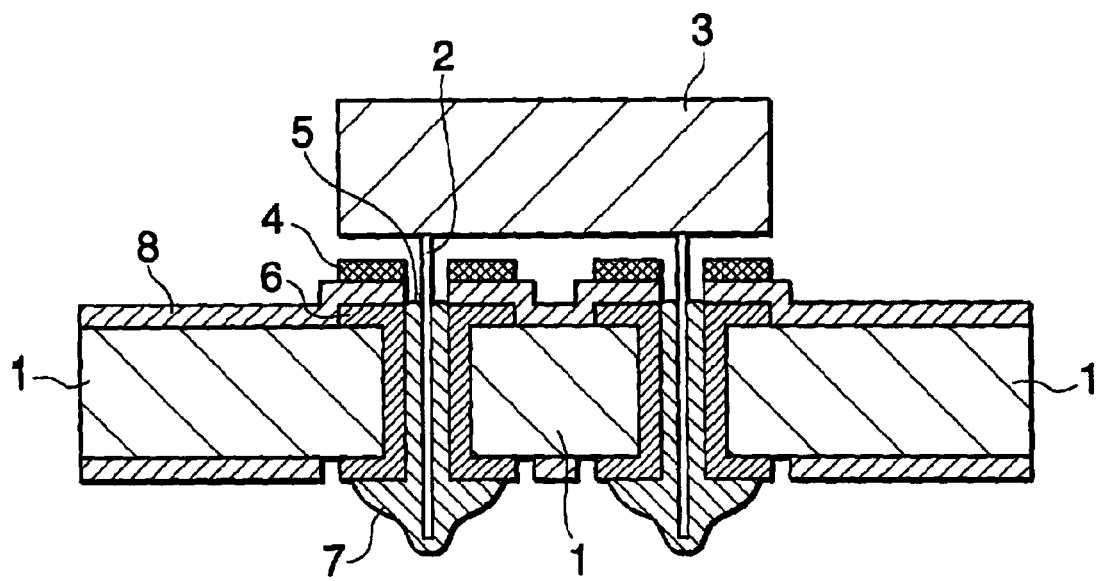
FIG. 3 is a sectional view showing a printed wiring board having an inserted component soldered thereto with lead-free solder, according to a third embodiment of the present invention.

FIG. 3 shows a third embodiment of the present invention. The constitution of the printed wiring board in the present embodiment is the same as in the first embodiment, with one change that the lands 6 are covered with both a silk-screen pattern 4 and a solder resist 8.

Even with this constitution, similar to the case of the first embodiment, because the silk-screen pattern 4 and the solder resist 8 are interposed between the inserted component leads 2 and the lands 6, it is possible to carry out flow soldering such that fillets 7 are not formed between the inserted component leads 2 and the lands 6.

Consequently, according to the present embodiment, as in the first embodiment, because fillets 7 are not formed between the inserted component leads 2 and the lands 6, good soldering can be obtained in which lift-off and land peeling do not occur and hence pattern breakage does not occur.

(Fourth Embodiment)

Figure 4:
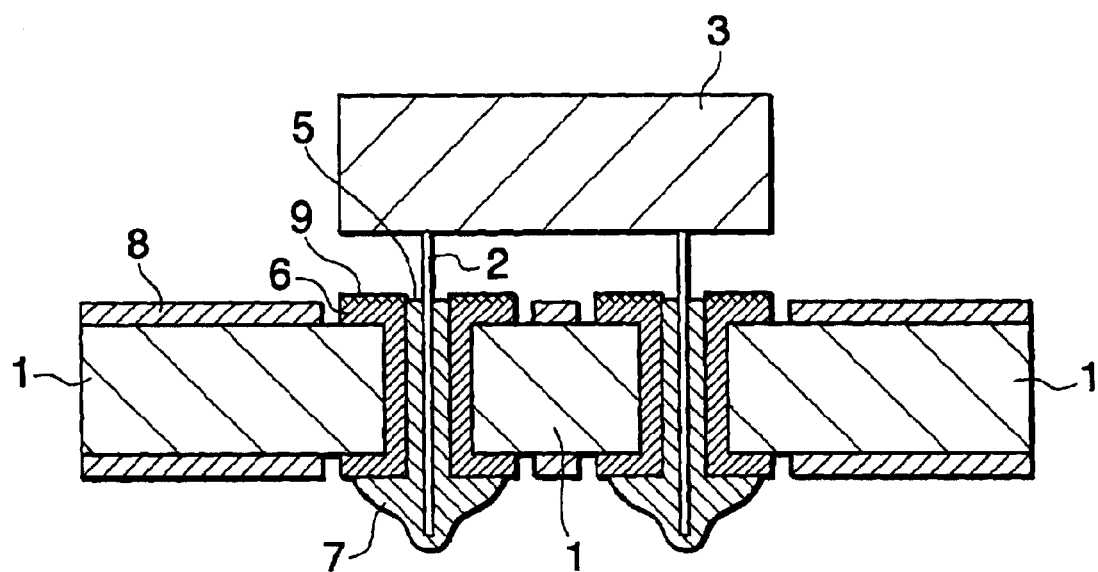
FIG. 4 is a sectional view showing a printed wiring board having an inserted component soldered thereto with lead-free solder, according to a fourth embodiment of the present invention.

FIG. 4 shows a fourth embodiment of the present invention. The constitution of the printed wiring board in the present embodiment is the same as in the first embodiment, with one change that deactivation treatment is carried out in which a surface 9 of each land 6 is oxidized to reduce the wettability to the solder, rather than the lands 6 being covered by a silk-printed pattern 4.

Even with this constitution, similar to the case of the first embodiment, because the surfaces 9 of the lands 6 between the inserted component leads 2 and the lands 6 are deactivation-treated and thus not wetted by the lead-free solder, it is possible to carry out flow soldering such that fillets 7 are not formed between the inserted component leads 2 and the lands 6.

Consequently, according to the present embodiment, as in the first embodiment, because fillets 7 are not formed between the inserted component leads 2 and the lands 6, good soldering can be obtained in which lift-off and land peeling do not occur and hence pattern breakage does not occur.

(Fifth Embodiment)

FIGS. 7 and 8 show a fifth embodiment of the present invention in which a solder resist 8 is applied onto one or more parts of the end surface of each land 6 on the major surface side of the substrate 1 of the printed wiring board. In FIGS. 7 and 8, reference numeral 10 designates a wiring pattern extending out from each land 6.

According to the present embodiment, it is possible to prevent the solder resist 8 from entering into the through holes 5 resulting in the strength of joining of the inserted component 3 to the substrate 1 dropping, which may happen if the solder resist 8 is applied over the whole of the end surface of each land 6 on the major surface side of the substrate 1.

In the present embodiment, the solder resist 8 is applied onto a part where the end surface of each land 6 on the major surface side of the substrate 1 of the printed wiring board and the wiring pattern 10 are connected together. As a result, breakage of the wiring pattern 10 caused by stress on the lands 6 during the solder joining can be prevented.

Embodiments of the present invention have been described above, but the present invention is not limited to these embodiments. The present invention can be realized by providing any means for maintaining a state in which the surface of each of the lands formed in the through holes into which the inserted component is soldered are not wetted by the lead-free solder.

Moreover, the leads of the inserted component may have already been treated with lead solder, the printed wiring board may be, for example, a double-faced printed wiring board or a multi-layered printed wiring board, and/or the lead-free solder may contain Bismuth.

What is claimed is:

1. A printed wiring board comprising:

a substrate having two opposite surfaces and a plurality of soldering through holes formed in said substrate, each of said plurality of soldering through holes opening in said opposite surfaces for inserting leads of an inserted component to be mounted onto the printed wiring board and for soldering said leads of an inserted component onto said substrate, wherein each of said plurality of soldering through holes has an inner peripheral surface and a pair of lands, each land of said pair of lands being formed on respective ones of said opposite surfaces and formed continuously over said inner peripheral surface, wherein at least one land of said pair of lands is connected to at least one wiring pattern at a connection portion;

wherein said connection portion is maintained in a state not wetted by solder; and wherein, except for said connection portion, said at least one land of said pair of lands is maintained in a state wetted by solder.

2. A printed wiring board as claimed in claim 1, wherein said connection portion is maintained in a state not wetted by solder using a material not wetted by solder coated onto said pair of lands.

3. A printed wiring board as claimed in claim 2, wherein the material not wetted by solder is a solder resist.

4. A printed wiring board as claimed in claim 2, wherein the material not wetted by solder is a silk-screen pattern.

5. A printing wiring board as claimed in claim 2, wherein the material not wetted by solder comprises a solder resist and a silk-screen pattern laminated onto each other.

6. A printed wiring board as claimed in claim 1, wherein said connection portion is maintained in a state not wetted by solder using deactivation treatment means for oxidizing at least a part of the surface of at least one land of said pair of lands.

7. A printed wiring board as claimed in claim 1, wherein lead solder is applied to the leads of the inserted component prior to insertion of said leads into said through-holes of said printed wiring board.

8. A printed wiring board as claimed in claim 1, wherein the inserted component is soldered onto said substrate by flow soldering using lead-free solder.

9. A printed wiring board as claimed in claim 8, wherein the lead-free solder contains Bismuth.

* * * * *